(12) United States Patent
Yokoi et al.

(10) Patent No.: US 8,192,923 B2
(45) Date of Patent: Jun. 5, 2012

(54) PHOTORESIST STRIPPING SOLUTION AND A METHOD OF STRIPPING PHOTORESISTS USING THE SAME

(75) Inventors: Shigeru Yokoi, Kanagawa-ken (JP); Kazumasa Wakiya, Kanagawa-ken (JP)

(73) Assignee: Tokyo Ohka Kogyo Co., Ltd., Kanagawa-Ken (JP)

( * ) Notice: Subject to any disclaimer, the term of this patent is extended or adjusted under 35 U.S.C. 154(b) by 899 days.

(21) Appl. No.: 11/898,174

(22) Filed: Sep. 10, 2007

(65) Prior Publication Data

US 2008/0011714 A1  Jan. 17, 2008

Related U.S. Application Data

(63) Continuation of application No. 11/503,189, filed on Aug. 14, 2006, now abandoned, which is a continuation of application No. 10/973,302, filed on Oct. 27, 2004, now abandoned, which is a continuation of application No. 10/208,096, filed on Jul. 31, 2002, now abandoned.

(30) Foreign Application Priority Data

Aug. 3, 2001 (JP) ................................. 2001-235884
Dec. 25, 2001 (JP) ................................. 2001-392290

(51) Int. Cl.
   *G03C 11/12* (2006.01)
(52) U.S. Cl. ........................................ 430/331; 430/258
(58) Field of Classification Search .................. 430/331, 430/258
   See application file for complete search history.

(56) References Cited

U.S. PATENT DOCUMENTS

| | | | | |
|---|---|---|---|---|
| 5,149,614 A * | 9/1992 | Akiyama et al. | ............... | 430/302 |
| 5,221,330 A * | 6/1993 | Matsumoto et al. | ............... | 106/2 |
| 5,304,252 A | 4/1994 | Condra et al. | | |
| 6,030,932 A | 2/2000 | Leon et al. | | |
| 6,326,130 B1 * | 12/2001 | Schwartzkopf et al. | ...... | 430/329 |
| 6,423,480 B2 | 7/2002 | Ichiki | | |
| 6,482,750 B2 | 11/2002 | Yokoi | | |
| 6,508,887 B1 | 1/2003 | Park et al. | | |
| 6,531,436 B1 * | 3/2003 | Sahbari et al. | ................ | 510/176 |
| 6,638,899 B1 | 10/2003 | Wakiya et al. | | |

FOREIGN PATENT DOCUMENTS

| | | |
|---|---|---|
| EP | 0 773 480 | 5/1997 |
| GB | 2 354 086 | 3/2001 |
| JP | 07-201794 | 8/1995 |
| JP | 08-202052 | 8/1996 |
| JP | 09-197681 | 7/1997 |
| JP | 10-151413 | 6/1998 |
| JP | 10-209604 | 8/1998 |
| JP | 10-265715 | 10/1998 |
| JP | 10-265979 | 10/1998 |
| JP | 11-016882 | 1/1999 |
| JP | 2000-096049 | 4/2000 |
| JP | 2000-199087 | 7/2000 |
| JP | 2000-273663 | 10/2000 |
| JP | 2001-051429 | 2/2001 |
| JP | 2001-083712 | 3/2001 |
| JP | 2001-083713 | 3/2001 |
| JP | 2001-183850 | 7/2001 |

OTHER PUBLICATIONS

Derwent-Week: 200820 shows the pertinent information on p. 1.*

* cited by examiner

*Primary Examiner* — Hoa V Le
(74) *Attorney, Agent, or Firm* — Wenderoth, Lind & Ponack, L.L.P.

(57) ABSTRACT

A photoresist stripping solution which comprises (a) a salt of hydrofluoric acid with a base free from metal ions, (b) a water-soluble organic solvent, (c) a mercapto group containing corrosion inhibitor, and (d) water, and a method of stripping photoresists with the use of the same are disclosed. In case of using ammonium fluoride as component (a), the photoresist stripping solution may further contain (e) a salt of hydrofluoric acid with a quaternary ammonium hydroxide, such as tetramethylammonium hydroxide, tetrapropylammonium hydroxide, etc., and/or an alkanolamine. The photoresist stripping solution of the present invention has an excellent effect of protecting both Al- and Cu-based metal wiring conductors from corrosion, of efficiently stripping photoresist films and post-ashing residues, and is free from the precipitation of the corrosion inhibitor.

12 Claims, No Drawings

PHOTORESIST STRIPPING SOLUTION AND A METHOD OF STRIPPING PHOTORESISTS USING THE SAME

This is a continuation of Ser. No. 11/503,189, filed Aug. 14, 2006, now abandoned, which is a continuation of Ser. No. 10/973,302, filed Oct. 27, 2004, now abandoned, which is a continuation of Ser. No. 10/208,096, filed Jul. 31, 2002, now abandoned.

BACKGROUND OF THE INVENTION

1. Field of the Invention

This invention relates to a photoresist stripping solution and a method of stripping photoresists using the same. More particularly, it relates to a photoresist stripping solution which is excellent in protecting both Al— and Cu-based wiring conductors and other metal conductors from corrosion and in stripping photoresist films and post-ashing residues; and a method of photoresists using the same. The present invention is suitable for use in the fabrication of semiconductor devices such as ICs and LSIs, as well as liquid-crystal panel apparatus.

2. Description of Relevant Art

The fabrication of semiconductor devices such as ICs and LSIs, as well as liquid-crystal panel apparatus, comprises forming a uniform photoresist coating over conductive metallic layers, insulation layers such as an $SiO_2$ film formed on a substrate (silicon wafer) by CVD; performing selective exposure and development to form a photoresist pattern; selectively etching the substrate having the conductive metallic layers, the insulation layers formed thereon using the photoresist pattern as a mask to thereby form a microcircuit; and then removing the unwanted photoresist layer with a stripping solution. For removal of such unwanted photoresist layers, various organic stripping solutions has been used from safety and strippability standpoints.

Examples of the conductive metallic layers formed by CVD as described above include those of aluminum (Al); aluminum alloys (Al alloys) such as aluminum-silicon (Al—Si), aluminum copper (Al—Cu) and aluminum-silicon-copper (Al—Si—Cu); titanium (Ti); titanium alloys (Ti alloys) such as titanium nitride (TiN) and titanium-tungsten (TiW); tantalum (Ta), tantalum nitride (TaN), tungsten (W), tungsten nitride (WN) and copper (Cu). These conductive metallic films are formed in one or more layers on the substrate. In recent years, both of devices having Al-based conductors (Al and Al alloy-based wirings) and devices having Cu-based conductors are coexisted. Accordingly, it has been required to protect both of these two types of devices from corrosion with the use of a single photoresist stripping solution.

Furthermore, with the recent tendency toward highly integrated, high-density circuits, dry etching enabling fine etching with a higher density has become the major means. Also, it has been a practice to employ plasma ashing to remove the unwanted photoresist layers remaining after etching. After these etching and ashing treatments, residues comprising modified photoresist films and other components that are referred to horn-like shaped "veil", "fences" or "side-walls" remain on the bottom or side wall of patterned grooves. In case of forming a pattern on a substrate having an Si-based interlayer film, such as an Si-based insulation film (SiN film, $SiO_2$ film, etc.) and a low dielectric film (SOG film, etc.), Si-based residues (Si-based depositions) are sometimes formed around pattern hole openings. In addition, etching of metallic layers and ashing treatment builds up metal depositions. Such post-ashing residues or depositions should be completely stripped away so as to keep good yields in the fabrication of semiconductors.

In recent years, further highly-density and highly-integrated substrates are needed, and thus the treating conditions in the etching and ashing steps become more and more strict. As a result, it is also urgently required to achieve improved corrosion resistance of metal wirings as well as improved residue-strippability of stripping solutions, compared with conventional ones.

Under these circumstances, there have been frequently employed stripping solutions for photoresists and post-ashing residues which contain amines or hydrofluoric acid as the main component. Among all, those containing hydrofluoric acid as the main component show excellent strippability especially for post-ashing residues.

Examples of stripping solutions containing hydrofluoric acid as the main component include: a resist stripping solution composition of pH 5-8 containing a salt of hydrofluoric acid with a base free from metal ions, a water-soluble organic solvent and water optionally together with a corrosion inhibitor (JP-A-9-197681); and a cleaner for semiconductor devices containing a quaternary ammonium salt and a fluorine compound, and further adding a water-soluble organic solvent (JP-A-7-201794).

The resist stripping solution composition in JP-A-9-197681 is to a certain extent effective in strippability and antiorrosivity on semiconductor devices having Al wiring conductors, however, it fails to exert any satisfactory effect of protecting devices having Cu wiring conductors from corrosion.

In the cleaner in JP-A-7-201794, tetramethylammonium formate and trimethyl(2-hydroxyethyl)ammonium salt are used as the quaternary ammonium salt. Although the corrosion of Cu wiring conductors can be relieved to a certain extent by using these compounds, there arises another problem that strippability for Cu-based metallic depositions (residues) is still insufficient.

JP-A-2000-273666 teaches a cleaner solution containing a sulfur-based corrosion inhibitor for protecting Cu wiring conductors from corrosion. However, any satisfactory strippability for Cu-based metallic depositions (residues) also cannot be established by using this cleaner solution.

As discussed above, none of the conventional photoresist stripping solutions can satisfy both of the requirements for efficient strippability and effective inhibition of metal corrosion. This is because strippability offsets the performance of inhibiting corrosion in a photoresist stripping solution. That is to say, there is a problem that one of the above-described requirement cannot be fulfilled unless the other is sacrificed. In the ultrafine processing employed in these days, in particular, the strippability for photoresist films and post-ashing residues should be further improved and it is therefore needed to enhance the effect of protecting metal wirings from corrosion. Recent models of semiconductor devices can be divided into two type, one using Al wiring conductors (Al, Al alloy and other Al-based metal wiring) and the other using Cu wiring conductors (Cu-based metal wiring). In addition to the need to protect devices of these two types from corrosion with the use of a single stripping solution, it is also required to provide effective protection against corrosion of other metals on the devices. Further improvements are desired to achieve effective stripping away of photoresists and post-ashing residues and to protect metal conductors from corrosion.

SUMMARY OF THE INVENTION

The present invention has been accomplished under these circumstances and has as an object of providing a photoresist stripping solution that is suitable for use in the photolithographic technology to form today's semiconductor and liquid-crystal display devices having an ever decreasing feature size and an increasing number of interlevel films superposed on the substrate, and that can assure effective protection of Al, Cu and other wiring metal conductors against corrosion as well as efficient stripping of the photoresist film and post-ashing residues.

To attain the above-described objects, the present invention provides a photoresist stripping solution which comprises (a) a salt of hydrofluoric acid with a base free from metal ions, (b) a water-soluble organic solvent, (c) a mercapto group containing corrosion inhibitor, and (d) water.

The present invention also provides a photoresist stripping solution which further contains, in addition to components (a)-(d), with the proviso that component (a) is ammonium fluoride, (e) a salt of hydrofluoric acid with a quaternary ammonium hydroxide represented by the following general formula (I) and/or an alkanolamine:

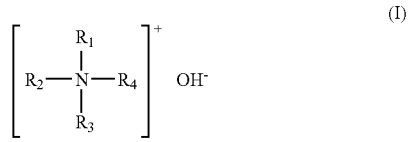

wherein $R_1$, $R_2$, $R_3$ and $R_4$ are each independently an alkyl group or a hydroxyalkyl group having 1 to 4 carbon atoms.

The present invention furthermore provides a method of stripping photoresists which comprises forming a photoresist pattern on a substrate, etching the substrate using the photoresist as a mask, and thereafter stripping away the photoresist pattern from the substrate using the photoresist stripping solution as described above.

The present invention still furthermore provides a method of stripping photoresists which comprises forming a photoresist pattern on a substrate, etching the substrate using the photoresist as a mask, then plasma ashing the photoresist pattern, and thereafter stripping away post-plasma ashing residues from the substrate using the photoresist stripping solution as described above.

DETAILED DESCRIPTION OF THE INVENTION

The present invention will be described below in detail.

In the present invention, component (a) is a salt of hydrofluoric acid with a base free from metal ions. Preferable examples of the base free from metal ions include hydroxylamines, organic amines such as primary, secondary or tertiary aliphatic amines, alicyclic amines, aromatic amines and heterocyclic amines, aqueous ammonia, and lower alkyl quaternary ammonium hydroxides.

Specific examples of the hydroxylamines include hydroxylamine ($NH_2OH$), N-methylhydroxylamine, N,N-dimethylhydroxylamine and N,N-diethylhydroxylamine.

Specific examples of the primary aliphatic amines include monoethanolamine, ethylenediamine and 2-(2-aminoethylamino)ethanol.

Specific examples of the secondary aliphatic amines include diethanolamine, N-methylaminoethanol, dipropylamine and 2-ethylaminoethanol.

Specific examples of the tertiary aliphatic amines include dimethylaminoethanol and ethyldiethanolamine.

Specific examples of the alicyclic amines include cyclohexylamine and dicyclohexylamine.

Specific examples of the aromatic amines include benzylamine, dibenzylamine and N-methylbenzylamine.

Specific examples of the heterocyclic amines include pyrrole, pyrrolidine, pyrrolidone, pyridine, morpholine, pyrazine, piperidine, N-hydroxyethylpiperidine, oxazole and thiazole.

Specific examples of the lower alkyl quaternary ammonium salts include tetramethylammonium hydroxide (TMAH), tetraethylammonium hydroxide, tetrapropylammonium hydroxide, trimethylethylammonium hydroxide, (2-hydroxyethyl)trimethylammonium hydroxide, (2-hydroxyethyl)triethylammonium hydroxide, (2-hydroxyethyl)tripropylammonium hydroxide and (1-hydroxypropyl)trimethylammonium hydroxide.

Among these bases, aqueous ammonia, monoethanolamine, N-methylaminoethanol, tetramethylammonium hydroxide and (2-hydroxyethyl)trimethylammonium hydroxide are preferable from availability and safety standpoints.

The bases free from metal ions may be used either alone or in combination with one another.

The salt of hydrofluoric acid with the base free from metal ions may be prepared using a commercially available hydrofluoric acid having a concentration of 50-60% and adding thereto the base free from metal ions. As the salt, ammonium fluoride ($NH_4F$) may be the most desirable. Either one or more salts may be used as component (a).

The content of component (a) preferably ranges 0.1-10 mass percent, still preferably 0.2-3 mass percent in the stripping solution of the invention. In case where the content of component (a) is too large, Cu wiring conductors tend to corrode. In case where its content is too small, on the other hand, the strippability is liable to be lowered.

As component (b) that is a water-soluble organic solvent, use may be made of those commonly employed in the art. Such a water-soluble organic solvent is not specifically restricted so long as it is miscible with water and other components employed in the present invention. Specific examples thereof include: sulfoxides, such as dimethyl sulfoxide; sulfones, such as dimethyl sulfone, diethyl sulfone, bis(2-hydroxyethyl)sulfone and tetramethylene sulfone; amides, such as N,N-dimethylformamide, N-methylformamide, N,N-dimethylacetamide, N-methylacetamide and N,N-diethylacetamide; lactams, such as N-methyl-2-pyrrolidone, N-ethyl-2-pyrrolidone, N-propyl-2-pyrrolidone, N-hydroxymethyl-2-pyrrolidone and N-hydroxyethyl-2-pyrrolidone; imidazolidinones, such as 1,3-dimethyl-2-imidazolidinone, 1,3-diethyl-2-imidazolidinone and 1,3-diisopropyl-2-imidazolidinone; and polyhydric alcohols and derivatives thereof, such as ethylene glycol, ethylene glycol monomethyl ether, ethylene glycol monoethyl ether, ethylene glycol monobutyl ether, ethylene glycol monomethyl ether acetate, ethylene glycol monoethyl ether acetate, diethylene glycol, diethylene glycol monomethyl ether, diethylene glycol monoethyl ether, diethylene glycol monobutyl ether, propylene glycol monomethyl ether, propylene glycol monoethyl ether, propylene glycol monopropyl ether and propylene glycol monobutyl ether. Among these organic solvents, preferable ones are dimethylformamide, N-methyl-2-pyrrolidone and dimethyl sulfoxide. Dimethylformamide is the most desirable since it can be easily handled after stripping treatment. Either one or more solvents may be used as component (b).

The content of component (b) preferably ranges 30-80 mass percent, still preferably 40-75 mass percent in the stripping solution of the present invention. In case where the content of component (b) is too large, the strippability is liable to be lowered. In case where its content is too small, on the other hand, various metal wiring conductors tend to corrode.

Although the mercapto group containing corrosion inhibitor to be used as component (c) is not specifically restricted so long as it can protect metal atoms employed in wiring conductors (in particular, Al wiring or Cu wiring) from corrosion, it is preferable to use a compound having in its structure a hydroxyl group and/or a carboxyl group at least one of the α- and β-positions. Specific examples of such a compound include 1-thioglycerol, 3-(2-aminophenylthio)-2-hydroxypropylmercaptan, 3-(2-hydroxyethylthio)-2-hydroxypropylmercaptan, 2-mercaptopropionic acid and 3-mercaptopropionic acid. Among these compounds, 1-thioglycerol is particularly preferable. In the present invention, component (c) is used as a corrosion inhibitor to thereby achieve an excellent effect of protecting Al and Cu wiring conductors from corrosion as well as an effect of preventing precipitation of the corrosion inhibitor.

Either one or more compounds may be used as component (c) The content of component (c) preferably ranges 0.1-10 mass percent, still preferably 0.2-5 mass percent in the stripping solution of the invention. In case where the content of component (a) is too small, there is a fear that insufficient effect may be provided for protecting in particular Cu wiring conductors from corrosion Component (d) in the stripping solution of the invention is water. Although some water is contained inevitably in other components, water is intentionally added to adjust the content The content of component (d) is the balance of the stripping solution of the present invention.

In addition to components (a)-(d), with the proviso that component (a) is ammonium fluoride, the stripping solution of the invention may further incorporate into the stripping solution (e) a salt of hydrofluoric acid with a quaternary ammonium hydroxide represented by the following general formula (I) and/or an alkanolamine:
wherein $R_1$, $R_2$, $R_3$ and $R_4$ are each independently an alkyl group or a hydroxyalkyl group having 1 to 4 carbon atoms. Use of component (e) contributes to the improvement in the strippability without seriously damaging Cu.

Specific examples of the quaternary ammonium hydroxide represented by the general formula (I) include tetramethylammonium hydroxide (TMAH), tetraethylammonium hydroxide, tetrapropylammonium hydroxide, tetrabutylammonium hydroxide, monomethyltripropylammonium hydroxide, trimethyleth-ylammonium hydroxide, (2-hydroxyethyl)trimethylammonium hydroxide, (2-hydroxyethyl)triethylammonium hydroxide, (2-hydroxyethyl)tripropylammonium hydroxide and (1-hydroxypropyl)trimethylammonium hydroxide. Among these compounds, TMAH, tetraethylammonium hydroxide, tetrapropylammonium hydroxide, tetrabutylammonium hydroxide, monomethyltripropylammonium hydroxide, (2-hydroxyethyl) trimethylammonium hydroxide, etc. are preferable from availability and safety standpoints.

Examples of the above-described alkanolamines include monoethanolamine, diethanolamine, triethanolamine, 2-(2-aminoethoxy)ethanol, N,N-dimethylethanolamine, N,N-diethylethanolamine, N,N-dibutylethanolamine, N-methylethanolamine, N-ethylethanolamine, N-butylethanolamine, N-methyldiethanolamine, monoisopropanolamine, diisopropanolamine and triisopropanolamine. Among these compounds, N-methylethanolamine is particularly preferable in terms of protecting Cu wiring conductors from corrosion.

Either one or more compounds may be used as component (e). The content of component (e) preferably ranges 0.1-10 mass percent, still preferably 0.2-3 mass percent in the stripping solution of the invention. In case where the content of component (e) is too large, Al wiring conductors tend to corrode.

In case of using component (e) in the present invention, it is preferable to adjust the composition ratio of ammonium fluoride employed as component (a) to component (e) [ammonium fluoride: component (e)] to from 2:8 to 8:2 by mass, still preferably from 3:7 to 7:3. By regulating the composition ratio of fluoride ammonium to component (e) within the range as specified above, metal wiring conductors can be more efficiently protected from corrosion. In case where the content of ammonium fluoride exceeds the upper limit as specified above, Al-based wiring conductors are prone to corrode. In case where the content of component (e) exceeds the upper limit as specified above, on the other hand, Cu-based wiring conductors are prone to corrode.

In order to improve penetrating properties, the stripping solution of the invention may further contain, as an optional component, an acetylene alcohol/alkylene oxide adduct prepared by adding an alkylene oxide to an acetylene alcohol.

As the acetylene alcohol as described above, use may be preferably made of compounds represented by the following general formula (II):

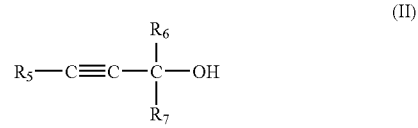

wherein $R_5$ is a hydrogen atom or a group represented by the following formula (III);

and $R_6$, $R_7$, $R_8$ and $R_9$ are each independently a hydrogen atom or an alkyl group having 1-6 carbon atoms.

These acetylene alcohols are commercially available under trade names of "Surfynol" and "Olfin" series (both are produced by Air Products and Chemicals Inc.). Among these commercial products, "Surfynol 104", "Surfynol 82" or mixtures thereof are most preferred for the physical properties. Use can be also made of "Olfin B", "Olfin P", "Olfin Y" etc.

As the alkylene oxide to be added to the acetylene alcohol as described above, it is preferred to use ethylene oxide, propylene oxide or a mixture thereof.

In the present invention, it is preferable to use, as the acetylene alcohol/alkylene oxide adduct, compounds represented by the following general formula (IV):

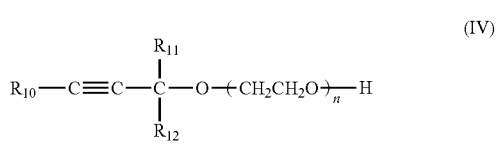

wherein $R_{10}$ is a hydrogen atom or a group represented by the following formula (V):

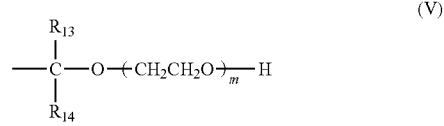

and $R_{11}$, $R_{12}$, $R_{13}$ and $R_{14}$ are each independently a hydrogen atom or an alkyl group having 1-6 carbon atoms; (n+m) is an integer of 1 to 30, which is the number of ethylene oxide molecules added. This number subtly affects the properties of the compound such as water solubility and surface tension.

The acetylene alcohol/alkylene oxide adducts per se are known as surfactants. These products are commercially available under the trade name "Surfynol" series (products of Air Product and Chemicals Inc.) and "Acetylenol" series (products of Kawaken Fine Chemicals Co., Ltd.) and have been appropriately utilized. Among these products, it is preferred to use "Surfynol 440" (n+m=3.5), "Surfynol 465" (n+m=10), "Surfynol 485" (n+m=30), "Acetylenol EL" (n+m=4), "Acetylenol EH" (n+m=10) or mixtures thereof, in view of the changes in their physical properties such as water solubility and surface tension depending on the number of ethylene oxide molecules added. A mixture of "Acetylenol EL" with "Acetylenol EH" in a mass ratio of 2:8 to 4:6 is particularly desirable.

Use of the acetylene alcohol/alkylene oxide adduct makes it possible to improve the penetrating properties and wetting properties of the stripping solution.

When the stripping solution of the invention contains the acetylene alcohol/alkylene oxide adduct, the content thereof is preferably 0.05-5 mass percent, more preferably 0.1-2 mass percent. When the content exceeds the upper limit as defined above, it tends to cause foaming but the wetting properties cannot be improved any more. When the content is less than the lower limit as defined above, on the other hand, the desired improvement in the wetting properties can be scarcely obtained.

To complete the stripping treatment in a short period of time, the stripping solution of the invention may further contain an acidic compound. Examples of the acidic compound include hydrofluoric acid, acetic acid and glycolic acid. In case of using such an acidic compound, its content is preferably 1 mass percent or less. When the stripping solution of the invention contains the acidic compound, the strippability of Si-based depositions can be particularly improved. Thus, the stripping time can be shortened and an excellent effect of stripping Si-based depositions can be established thereby.

The photoresist stripping solution of the invention can advantageously be used with all photoresists, whether negative- or positive-working, that can be developed with aqueous alkaline solutions. Such photoresists include, but are not limited to, (i) a positive-working photoresist containing a naphthoquinonediazide compound and a novolak resin, (ii) a positive-working photoresist containing a compound that generates an acid upon exposure, a compound that decomposes with an acid to have a higher solubility in aqueous alkali solutions, and an alkali-soluble resin, (iii) a positive-working photoresist containing a compound that generates an acid upon exposure and an alkali-soluble resin having a group that decomposes with an acid to have a higher solubility in aqueous alkali solutions, and (iv) a negative-working photoresist containing a compound that generates an acid upon illumination with light, a crosslinker and an alkali-soluble resin.

According to the invention, photoresists are stripped away by one of two methods which have the following steps in common: forming a photoresist pattern by lithography on a substrate having conductive metallic layers, insulation layers and low-dielectric layers thereon, and selectively etching the layers with the photoresist pattern used as a mask to form a fine-line circuit. After these steps, the photoresist pattern is immediately stripped away (method I), or the etched photoresist pattern is subjected to plasma ashing and thereby post-ashing residues, such as the modified photoresist film (photoresist film residue) and metal deposition, are stripped away (method II).

An example of method I in which the photoresist film is stripped away immediately after etching comprises:
(I) providing a photoresist layer on a substrate;
(II) selectively exposing said photoresist layer;
(III) developing the exposed photoresist layer to provide a photoresist pattern;
(IV) etching the substrate to form a pattern using said photoresist pattern as a mask; and
(V) stripping away the photoresist pattern from the etched substrate using the photoresist stripping solution of the present invention.

An example of method II in which the modified photoresist film and metal deposition resulting from plasma ashing are stripped away after etching comprises:
(I) providing a photoresist layer on a substrate;
(II) selectively exposing said photoresist layer;
(III) developing the exposed photoresist layer to provide a photoresist pattern;
(IV) etching the substrate to form a pattern using said photoresist pattern as a mask;
(V) plasma ashing the photoresist pattern;
(VI) stripping away the post-ashing residues using the photoresist stripping solution of the present invention.

The specific advantage of the present invention resides in that the photoresist stripping solution has excellent effects of stripping photoresist films and post-ashing residues (modified photoresist films, metal depositions, etc.) and protecting a substrate having metal conductors from corrosion both in stripping away photoresists formed on a substrate having Al wiring conductors and formed on a substrate having Cu wiring conductors.

Examples of the metal wiring conductors include, but are not limited to, those made of aluminum (Al); aluminum alloys such as aluminum copper (Al—Cu) and aluminum-silicon-copper (Al—Si—Cu); titanium (Ti); titanium alloys (Ti alloys) such as titanium nitride (TiN) and titanium-tungsten (TiW); and copper (Cu).

Using conventional photoresist stripping solutions, it is very difficult to satisfy both of the requirements for efficient strippability for photoresists and post-ashing residues and effective inhibition of metal corrosion in Al-based wiring devices and Cu-based wiring devices. According to the present invention, however, both of these requirements can be successfully satisfied by combining components (a)-(d) with each other. Using component (e) in addition to components (a)-(d), with the proviso that component (a) is ammonium fluoride, the strippability can be further improved without seriously damaging Cu.

In the second stripping method described above, residue adhere to the substrate surface after plasma ashing, such as photoresist residue (modified photoresist film) and metal deposition that formed during etching of the metal film. These residues are contacted by the stripping solution of the invention so that they are stripped away from the substrate surface. Plasma ashing is inherently a method for removing the photoresist pattern but it often occurs that part of the photoresist pattern remains as a modified film; the present invention is particularly effective for the purpose of completely stripping away such modified photoresist film.

In forming the photoresist layer, and exposing, developing and etching treatments, any conventional means may be employed without particular limitation.

After the development step (III) or the stripping step (V) or (VI), conventional rinsing may optionally be performed using pure water, lower alcohols, etc., followed by drying.

The photoresist is usually stripped by the dip, shower or paddle method. The stripping time is not limited to any duration as long as it is sufficient to achieve removal of the photoresist.

EXAMPLES

The following examples are provided for the purpose of further illustrating the present invention but are in no way to be taken as limiting. Unless otherwise noted, all compounding amounts are expressed by mass percent.

[Treatment I]

A silicon wafer having an $SiO_2$ layer formed thereon was used as a substrate. On this substrate, a TiN layer, an Al—Si—Cu layer and another TiN layer were successively formed thereon respectively as the first, second and third layers. The topmost layer was spin-coated with a positive-working photoresist (TDUR-P015 of Tokyo Ohka Kogyo Co., Ltd.), which was prebaked at 80° C. for 90 seconds to form a photoresist layer 0.7 μm thick.

The photoresist layer was exposed through a mask pattern using FPA 3000 EX3 (Canon Inc.), then subjected to post-exposure bake at 110° C. for 90 seconds and developed with an aqueous solution of 2.38 mass percent tetraammonium hydroxide (TMAH) to form a photoresist pattern of 400 nm in line-and-space. Subsequently it was subjected to dry etching and plasma ashing.

[Treatment II]

A silicon wafer having Cu layer that is overlaid with an $SiO_2$ layer formed by plasma CVD was used as a substrate. The substrate was spin-coated with a positive-working photoresist (TDUR-P015 of Tokyo Ohka Kogyo Co., Ltd.), which was prebaked at 80° C. for 90 seconds to form a photoresist layer 0.7 μm thick.

The photoresist layer was exposed through a mask pattern using FPA 3000 EX3 (Canon Inc.), then subjected to post-exposure bake at 110° C. for 90 seconds and developed with an aqueous solution of 2.38 mass percent tetraammonium hydroxide (TMAH) to form a hole pattern of 200 nm in diameter. Subsequently it was subjected to dry etching and plasma ashing.

Examples 1-8 and Comparative Examples 1-5

The thusly treated substrate in treatment I or II as described above was dipped (25° C., 5 minutes) in each photoresist stripping solution as indicated in Table 1 for stripping. In Example 8, dipping was carried out for 1 minute. After the completion of the stripping treatment, each substrate was rinsed with purified water. Then the substrate was observed under a scanning electron microscope (SEM) to evaluate strippability of the post-ashing residues, state of corrosion of metal wiring conductors and precipitation of the corrosion inhibitor. The results are shown in Table 2.

The strippability of the post-ashing residues, state of corrosion of metal wiring conductors and precipitation of the corrosion inhibitor were evaluated in accordance with the following criteria.

The strippability of the post-ashing residues was evaluated by using the substrate treated in treatment II. Regarding the protection of metals from corrosion, the substrate treated in treatment I was mainly used for Al wiring, and the one treated in treatment II was mainly used for Cu wiring. The precipitation of the corrosion inhibitor was evaluated by using the substrate treated in treatment II.

[(Strippability of Post-Ashing Residues (Cu-Based Depositions and Si-Based Depositions)]

◉: Complete stripping

○: Almost complete stripping

Δ: Some residues remained

×: Much residues remained

[Protection of Metal Wiring Conductors (Al and Cu) from Corrosion]

◉: No corrosion found

○: Little corrosion found

Δ: Suffered from somewhat corrosion

×: Suffered from corrosion

[State of Precipitation of Corrosion Inhibitor]

◉: No precipitation of corrosion inhibitor found

○: Little precipitation of corrosion inhibitor found

Δ: Suffered from somewhat precipitation of corrosion inhibitor

×: Suffered from precipitation of corrosion inhibitor

TABLE 1

| | Photoresist stripping solution (mass %) | | | | | |
|---|---|---|---|---|---|---|
| | Component (a) | Component (b) | Component (c) | Component (d) | Component (e) | Other component |
| Ex. 1 | $NH_4F$ (0.5) | DMSO (70) | Cor. inhib. A (2) | water (27.5) | — | — |
| Ex. 2 | $NH_4F$ (2) | DMSO (50) | Cor. inhib. B (1) | water (47) | — | — |
| Ex. 3 | $NH_4F$ (1) | DMF (60) | Cor. inhib. C (1) | water (37.5) | — | acetylene alcohol/ alkylene oxide adduct (0.5) |
| Ex. 4 | $NH_4F$ (0.5) | DMSO (70) | Cor. inhib. D (1) | water (28) | HF/TMAH (0.5) | — |
| Ex. 5 | $NH_4F$ (1.2) | DMSO (50) | Cor. inhib. E (0.5) | water (45.5) | HF/TPAH (1.8) | acetylene alcohol/ alkylene oxide adduct (1) |
| Ex. 6 | $NH_4F$ (0.6) | DMF (70) | Cor. inhib. A (1) | water (28) | HF/TMAH (0.4) | — |

TABLE 1-continued

| | Photoresist stripping solution (mass %) | | | | | |
|---|---|---|---|---|---|---|
| | Component (a) | Component (b) | Component (c) | Component (d) | Component (e) | Other component |
| Ex. 7 | NH₄F (0.4) | NMP (70) | Cor. inhib. A (1) | water (28) | HF/TMAH (0.6) | — |
| Ex. 8 | NH₄F (0.5) | NMP (70) | Cor. inhib. A (1) | water (27.7) | HF/TMAH (0.5) | acetic acid(0.3) |
| Com. Ex. 1 | NH₄F (2) | DMSO (60) | Cor. inhib. X (2) | water (36) | — | — |
| Com. Ex. 2 | NH₄F (1) | DMSO (50) | Cor. inhib. Y (1) | water (48) | — | — |
| Com. Ex. 3 | NH₄F (0.5) | DMSO (75) | Cor. inhib. Z (2) | water (22.5) | — | — |
| Com. Ex. 4 | NH₄F (0.5) | DMSO (70) | Cor. inhib. X (1) | water (28) | HF/TMAH (0.5) | — |
| Com. Ex. 5 | NH₄F (2) | DMSO (50) | Cor. inhib. X (0.5) | water (46.5) | HF/TPAH (1) | — |

The symbols used in Table 1 to indicate respective components have the following definitions.

NH₄F: ammonium fluoride
DMSO: dimethyl sulfoxide
DMF: dimethylformamide
NMP: N-methyl-2-pyrrolidone
Cor. inhib. A: 1-thioglycerol
Cor. inhib. B: 3-(2-aminophenylthio)-2-hydroxypropylmercaptan
Cor. inhib. C: 3-(2-hydroxyethylthio)-2-hydroxypropylmercaptan
Cor. inhib. D: 2-mercaptopropionic acid
Cor. inhib. E: 3-mercaptopropionic acid
Cor. inhib. X: 2,2'-{[(4-methyl-1H-benzo-triazol-1-yl)methyl]imino}-bisethanol ("IRGAMET 42")
Cor. inhib. Y: pyrogallol
Cor. inhib. Z: pyrocatechol
HF/TMAH: salt of hydrofluoric acid (HF) with tetramethyl-ammonium hydroxide (TMAH)
HF/TPAH: salt of hydrofluoric acid (HF) with tetrapropyl-ammonium hydroxide (TPAH)

TABLE 2

| | Strippability of post-ashing residues | | Protection of metal conductor from corrosion | | Precipitation of corrosion inhibitor |
|---|---|---|---|---|---|
| | Cu-based deposition | Si-based deposition | Cu wiring | Al wiring | |
| Ex. 1 | ○ | ○ | ○ | ○ | ○ |
| Ex. 2 | ○ | ○ | ○ | ○ | ○ |
| Ex. 3 | ○ | ○ | ○ | ○ | ○ |
| Ex. 4 | ○ | ○ | ◎ | ○ | ○ |
| Ex. 5 | ○ | ○ | ◎ | ○ | ○ |
| Ex. 6 | ○ | ○ | ◎ | ○ | ○ |
| Ex. 7 | ○ | ○ | ◎ | ○ | ○ |
| Ex. 8 | ○ | ◎ | ◎ | ○ | ○ |
| Com. Ex. 1 | ○ | ○ | Δ | ○ | X |
| Com. Ex. 2 | ○ | ○ | X | ○ | ○ |
| Com. Ex. 3 | ○ | ○ | X | ○ | ○ |
| Com. Ex. 4 | ○ | ○ | Δ | ○ | X |
| Com. Ex. 5 | ○ | ○ | Δ | ○ | X |

As described above in detail, according to the present invention, there is provided an excellent photoresist stripping solution that causes no corrosion of Al and Cu wiring conductors or any other metals, has excellent strippability for photoresist films and post-ashing residues and is free from precipitation of a corrosion inhibitor. Use of the photoresist stripping solution of the present invention makes it possible to effectively protect both of devices having Al wiring conductors and devices having Cu wiring conductors from corrosion.

What is claimed is:

1. A photoresist stripping solution which comprises (a) a salt of hydrofluoric acid with a base free from metal ions, (b) a water-soluble organic solvent, (c) a mercapto group containing corrosion inhibitor, and (d) water, wherein the corrosion inhibitor is present at 0.5 to 2% by mass and wherein component (c) is at least one member selected from the group consisting of 3-(2-aminophenylthio)-2-hydroxypropylmercaptan, 3-(2-hydroxyethylthio)-2-hydroxypropylmercaptan, 2-mercaptopropionic acid and 3-mercaptopropionic acid.

2. The photoresist stripping solution according to claim 1, wherein component (a) is ammonium fluoride.

3. The photoresist stripping solution according to claim 1, wherein component (b) is at least one member selected from among dimethylformamide, N-methyl-2-pyrrolidone and dimethyl sulfoxide.

4. The photoresist stripping solution according to claim 1, which further contains, in addition to components (a)-(d), with the proviso that component (a) is ammonium fluoride, (e) a salt of hydrofluoric acid with a quaternary ammonium hydroxide represented by the following general formula (I) and/or an alkanolamine:

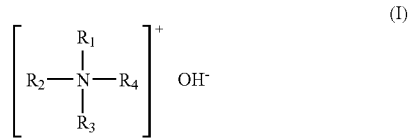

wherein $R_1$, $R_2$, $R_3$ and $R_4$ are each independently an alkyl group or a hydroxyalkyl group having 1 to 4 carbon atoms.

5. The photoresist stripping solution according to claim 4, wherein the composition ratio of component (a): component (e) ranges from 2:8 to 8:2 by mass.

6. A method of stripping photoresists which comprises forming a photoresist pattern on a substrate, etching the substrate using said photoresist as a mask, and thereafter stripping away the photoresist pattern from the substrate using the photoresist stripping solution according to claim 1.

7. A method of stripping photoresists which comprises forming a photoresist pattern on a substrate, etching the substrate using said photoresist as a mask, then plasma ashing the photoresist pattern, and thereafter stripping away post-plasma ashing residues from the substrate using the photoresist stripping solution according to claim 1.

8. The method of stripping photoresists according to claim 6, wherein the substrate has either Al wiring conductor or Cu wiring conductor or both thereon.

9. The method of stripping photoresists according to claim 6, wherein the substrate has at least an Si-based interlevel film thereof.

10. The method of stripping photoresists according to claim 7, wherein the substrate has either Al wiring conductor or Cu wiring conductor or both thereon.

11. The method of stripping photoresists according to claim 7, wherein the substrate has at least an Si-based interlevel film thereof.

12. The photoresist stripping solution according to claim 1, wherein the corrosion inhibitor is present at 0.5 to 1% by mass.

* * * * *